United States Patent [19]
Chan

[11] Patent Number: 5,653,811
[45] Date of Patent: Aug. 5, 1997

[54] SYSTEM FOR THE PLASMA TREATMENT OF LARGE AREA SUBSTRATES

[76] Inventor: Chung Chan, 8 Pontiac Rd., Newton, Mass. 02168

[21] Appl. No.: 503,973

[22] Filed: Jul. 19, 1995

[51] Int. Cl.$^6$ .................................................. C23C 16/00
[52] U.S. Cl. ................................ 118/723 I; 118/723 MP
[58] Field of Search ........................... 156/345, 626.1, 156/627.1; 118/718, 723 I, 723 IR, 723 MP; 204/665

[56] References Cited

U.S. PATENT DOCUMENTS

| | | | |
|---|---|---|---|
| 4,006,340 | 2/1977 | Gorinas | 219/121 P |
| 4,566,403 | 1/1986 | Fournier | 118/718 |
| 4,846,928 | 7/1989 | Dolins et al. | 156/626 |
| 4,847,792 | 7/1989 | Barna et al. | 364/552 |
| 4,853,250 | 8/1989 | Boulose et al. | 427/34 |
| 4,887,005 | 12/1989 | Rough et al. | 315/111.21 |
| 4,948,458 | 8/1990 | Ogle | 154/643 |
| 4,952,273 | 8/1990 | Popov | 156/643 |
| 4,960,073 | 10/1990 | Suzuki et al. | 118/723 MR |
| 4,996,077 | 2/1991 | Moslehi et al. | 427/38 |
| 5,015,353 | 5/1991 | Hubler et al. | 427/527 |
| 5,133,826 | 7/1992 | Dandl | 156/345 |
| 5,202,095 | 4/1993 | Houchin et al. | 422/186 |
| 5,203,960 | 4/1993 | Dandl | 156/643 |
| 5,234,529 | 8/1993 | Johnson | 156/345 |
| 5,250,328 | 10/1993 | Otto | 427/535 |
| 5,252,178 | 10/1993 | Moslehi | 156/643 |
| 5,273,610 | 12/1993 | Thomas, III et al. | 156/345 |
| 5,342,472 | 8/1994 | Imahashi et al. | 156/345 |
| 5,368,710 | 11/1994 | Chen et al. | 204/192.32 |
| 5,370,765 | 12/1994 | Dandl | 156/643 |
| 5,404,079 | 4/1995 | Ohkuni et al. | 315/111.81 |
| 5,405,480 | 4/1995 | Benzing et al. | 156/345 |
| 5,411,592 | 5/1995 | Izu et al. | 118/718 |
| 5,435,880 | 7/1995 | Minato et al. | 156/345 |
| 5,487,785 | 1/1996 | Horiike et al. | 118/723 E |
| 5,504,328 | 4/1996 | Bonser | 250/288 |

FOREIGN PATENT DOCUMENTS

| | | | |
|---|---|---|---|
| 0379828 | 12/1989 | European Pat. Off. | |
| 0459177 | 5/1991 | European Pat. Off. | |
| 0193904 | 11/1984 | Japan | 118/723 IR |
| 2231197 | 3/1990 | United Kingdom | |

OTHER PUBLICATIONS

Pieter Burggraaf, Sr. Ed., "Advanced Plasma Sources: What's Working?," Semiconductor International, pp. 56-59 May 1994.

*Primary Examiner*—John Niebling
*Assistant Examiner*—Joni Y. Chang
*Attorney, Agent, or Firm*—Weingarten, Schurgin, Gagnebin & Hayes LLP

[57] ABSTRACT

A plasma system for processing large area substrates. In one embodiment the system includes a plurality of radiofrequency (rf) plasma sources removably attached to the rf transparent windows of a processing chamber. The number and distribution of sources is varied to provide the size and uniformity of the plasma field required to treat the substrate. A plurality of plasma probes, such as Langmuir probes, Faraday cups and optical sensor are positioned within the chamber and in electrical communication with the plasma sources adjust the rf field produced by the individual sources to maintain the desired degree of field uniformity.

14 Claims, 6 Drawing Sheets

SYSTEM FOR THE PLASMA TREATMENT OF LARGE AREA SUBSTRATES

FIELD OF THE INVENTION

The invention relates to devices for plasma treating substrates and more particularly to rf devices for plasma treating large area substrates.

BACKGROUND OF THE INVENTION

Plasma treatment of large area substrates such as glass or semiconductor substrates used in the fabrication of flat panel displays or 300 mm silicon wafers respectively pose a series of problems that do not occur in the processing of small area substrates. One problem is simply the generation of plasmas of sufficient area to treat the large area substrate. A second problem is the maintenance of the uniformity of the plasma density and chemistry over such a large area.

The use of inductively or transformer coupled plasma sources (ICP and TCP, respectively) are affected both by the difficulty of maintaining plasma uniformity using inductive coil antenna designs and the cost of fabricating and maintaining such systems which require large and thick quartz windows for coupling the antenna radiation into the processing chamber. The use of such thick quartz windows results in an increase in rf power (and reduction in efficiency) due to heat dissipation within the window.

The use of Electron Cyclotron Resonance (ECR) and Helicon type sources are limited by the difficulty in scaling the resonant magnetic field to large areas when a single antenna or waveguide is used. Furthermore, most ECR sources utilize microwave power which is more expensive and difficult to tune electrically. The use of hot cathode plasma sources results in the contamination of the plasma environment due to the evaporation of cathode material, while cold cathode sources result in contamination due to exposure of the cold cathode to the plasma generated.

The present invention avoids these problems encountered by previous large area plasma processing systems.

SUMMARY OF THE INVENTION

The present invention relates to an easily scalable and maintainable system for producing a uniform plasma of any size. In one embodiment a plurality of rf plasma sources are removably attached to the dielectric windows such as glass or quartz of a vacuum processing chamber, while in another embodiment each of the plurality of sources includes its own window and is attached to the chamber. Plasma measuring probes within the chamber provide information on the plasma uniformity and this information is used to control the rf energy applied to each of the rf plasma sources so as to maintain the desired uniformity. In one embodiment, the plasma measuring probes are Langmuir probes. In another embodiment, the probes are Faraday cups. In yet another embodiment, the probes are optical probes.

In another embodiment, a plasma source includes a quartz window with an integral tube for gas introduction. Several of such plasma sources using different gases may be combined in a linear array for the sequential treatment of substrates in an inline processing system.

BRIEF DESCRIPTION OF THE FIGURES

This invention is pointed out with particularity in the appended claims. The above and further advantages of this invention may be better understood by referring to the following description taken in conjunction with the accompanying drawing, in which:

DESCRIPTION OF THE PREFERRED EMBODIMENT

Figure 1:
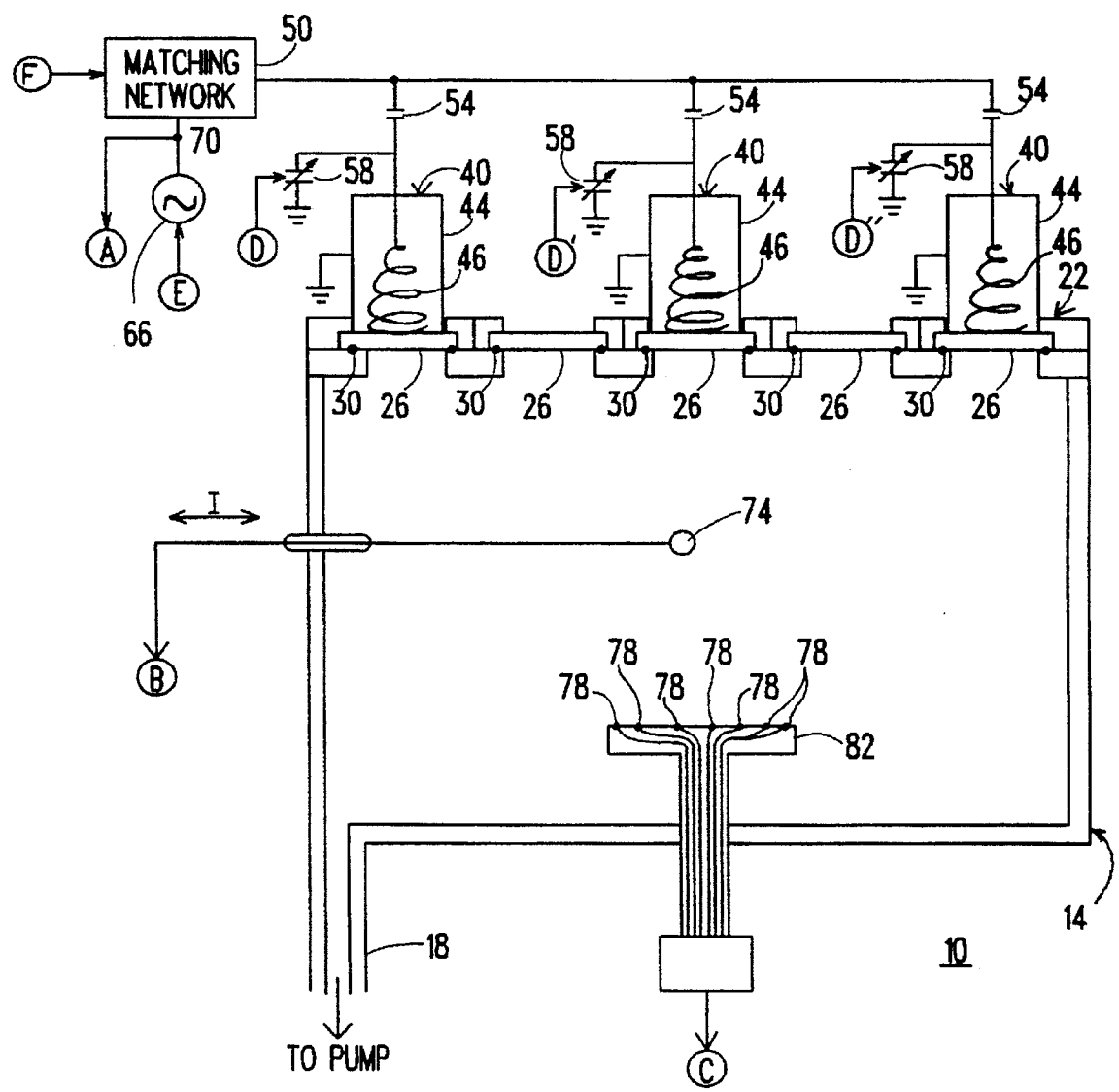
FIG. 1 is a block diagram of an embodiment of the plasma treating system of the invention.
Figure 1:
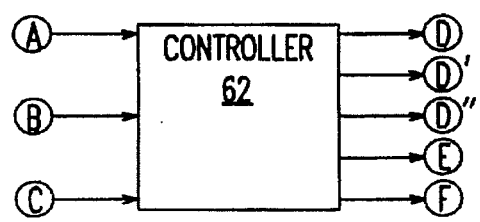

In brief overview and referring to FIG. 1, an embodiment of the system of the invention 10 includes a vacuum chamber 14 having a vacuum port 18 connected to a vacuum pump (not shown). In the embodiment shown, the system 10 includes a series of dielectric windows 26 vacuum sealed by o-rings 30 and attached by removable clamps 34 to the upper surface 22 of the vacuum chamber 14. Removably attached to some of these dielectric windows 26 are rf plasma sources 40, in one embodiment having a helical or pancake antennae 46 located within an outer shield/ground 44. Other embodiments of the antennae using capacitive or inductive coupling may be used. Cooling of each antenna is accomplished by passing a cooling fluid through the antenna. Cooling is typically required only at higher power. The windows 26 without attached rf plasma sources 40 are usable as viewing ports into the chamber 14. The removability of each plasma source 40 permits the associated dielectric window 26 to be cleaned or the plasma source 40 replaced without the vacuum within the system 10 being removed. Although glass windows are used in this embodiment, other dielectric material such as quartz or polyethylene may be used for the window material.

Each antenna 46 is connected to a rf generator 66 through a matching network 50, through a coupling capacitor 54. Each antenna 46 also includes a tuning capacitor 58 connected in parallel with its respective antenna 46. Each of the tuning capacitors 58 is controlled by a signal D, D', D" from a controller 62. By individually adjusting the tuning capacitors 85, the output power from each rf antenna 46 can be adjusted to maintain the uniformity of the plasma generated. Other tuning means such as zero reflective power tuning may also be used to adjust the power to the antennae. In one embodiment, the rf generator 66 is controlled by a signal E from the controller 62. In one embodiment, the controller 62 controls the power to the antennae 46 by a signal F to the matching network 50.

The controller 62 adjusts the tuning capacitors 58 and the rf generator 66 in response to a signal A from a sensor 70 (such as a Real Power Monitor by Comdel, Inc., Beverly, Mass.) monitoring the power delivered to the antennae 46, a signal B from a fast scanning Langmuir probe 74 directly measuring the plasma density and a signal C from a plurality of Faraday cups 78 attached to a substrate wafer holder 82. The Langmuir probe 74 is scanned by moving the probe (double arrow I) into and out of the plasma. With these sensors, the settings for the rf generator 66 and the tuning capacitors 58 may be determined by the controller prior to the actual use of the system 10 to plasma treat a substrate. Once the settings are determined, the probes are removed and the wafer to be treated is introduced. In another embodiment of the system, the probes are left in place during processing to permit real time control of the system. In such an embodiment using a Langmuir probe, care must be taken to not contaminate the plasma with particles evaporating from the probe and to not shadow the substrate being processed. In yet another embodiment of the system, the characteristics of the system are determined at manufacture and the system does not include plasma probes.

Figure 2:
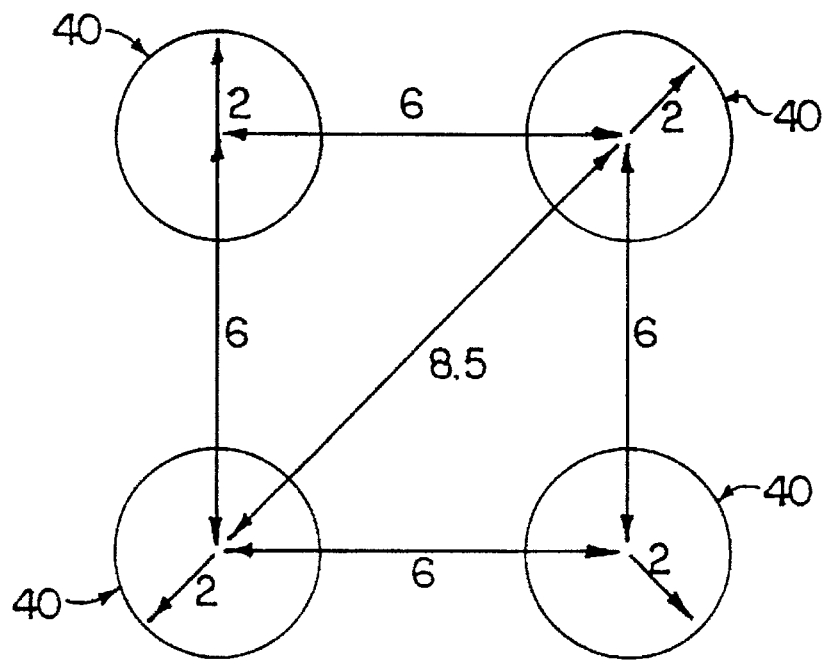
FIG. 2 is a top view of a configuration of sources to provide a large area plasma coverage using small area plasma sources.

Referring to FIG. 2, the configuration of plasma sources 40 may be such that a plurality of physically smaller plasma sources 40 produce a uniform plasma over an area greater than that of sum of the areas of the individual sources. In the embodiment of the configuration shown, four four-inch diameter plasma sources 40 spaced at the corners of a square at six inch centers produce a plasma substantially equivalent to that generated by a single twelve inch diameter source. Therefore, by providing a vacuum chamber 14 with a plurality of windows 26, the various configurations of plasma sources 40 may be formed to produce a uniform plasma of the shape and uniformity desired. Antennae such as those depicted do not result in rf interference between sources when properly shielded as shown.

Multiple rf plasma sources can excite electron cyclotron resonance in the presence of a multi-dipole surface magnetic field. Such a surface magnetic field would, for example, be approximately 1 KG at the pole face and would drop to a few Gauss at about 10 cm. from the pole face. In such a system, electron cyclotron resonance may be established, with the electron cyclotron resonance frequency (in Hz) being given by the expression $v=2.8\times10^6$ (B) where B is the magnetic field strength in Gauss. Thus, if the fundamental electron cyclotron resonance frequency is 13.56 MHz (that is, the frequency supplied by the rf generator) the magnetic field required (as applied by the magnets) is 4.8 G, for resonance coupling to take place. Higher harmonics of the fundamental resonance frequency may be achieved by increasing the magnetic field proportionately. Thus for a second harmonic to be coupled, the magnetic field would have to be increased to 9.6 G. Such ECR coupling is most effective at lower pressures (P<1 mTorr). The use of the small rf plasma sources permit such magnets to be positioned so as to make electron cyclotron resonance possible.

Figure 3:
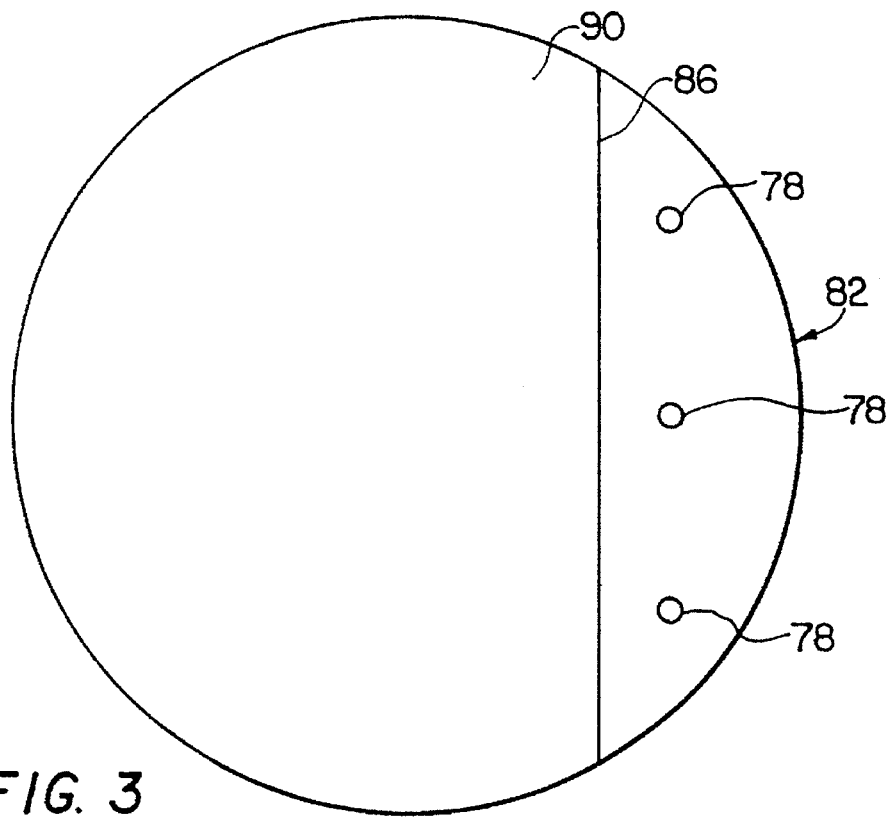
FIG. 3 is a plan view of an embodiment of a wafer holder with built-in faraday cups.
Figure 3A:
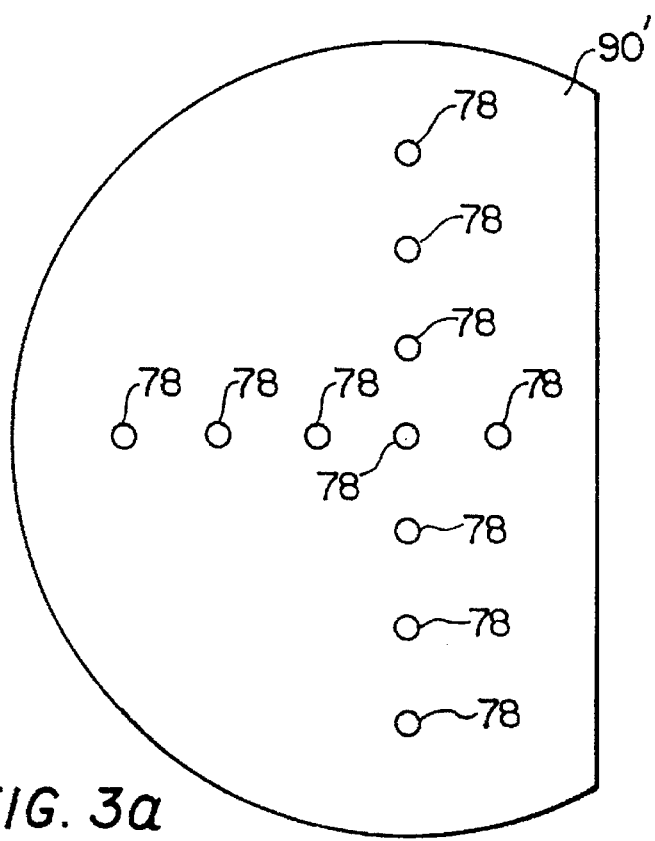
FIG. 3a is a plan view of an embodiment of a Si test wafer with imbedded faraday cups.

The faraday cups 78 used to measure the uniformity of the field and the plasma dose, in one embodiment, are positioned near one edge in the surface of the wafer holder 82 (FIG. 3). The flat edge 86 of wafer 90 is positioned on the wafer holder 82 such that faraday cups 78 of the wafer holder 82 are exposed to the plasma. In this way the plasma dose experienced by the wafer 90 can be directly measured. Alternatively, a special wafer 90', as shown in FIG. 3a, is fabricated with a plurality of faraday cups 78 embedded in the wafer 90' This special wafer 90' is used to set the rf generator 66 and the tuning capacitors 58 to achieve the desired plasma density and uniformity. Once the operating parameters have been determined, the special wafer 90' is removed and the wafers 90 to be processed placed on the wafer holder 82.

Figure 4:
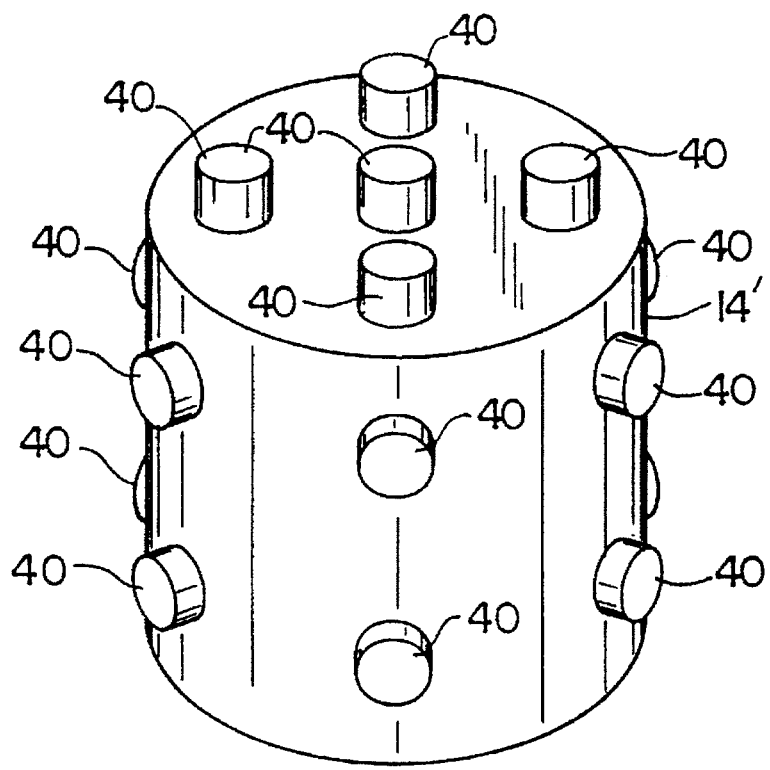
FIG. 4 is a perspective view of an embodiment of the invention configured as a volume source.

Referring to FIG. 4, although the system 10 has been described in terms of a planar array of plasma sources 40 located on the upper surface of the vacuum chamber 14, the plasma sources 40 may be distributed over other surfaces of the vacuum chamber 14' to generate a uniform volume of plasma. Such a system is particularly effective in batch processing.

Figure 5:
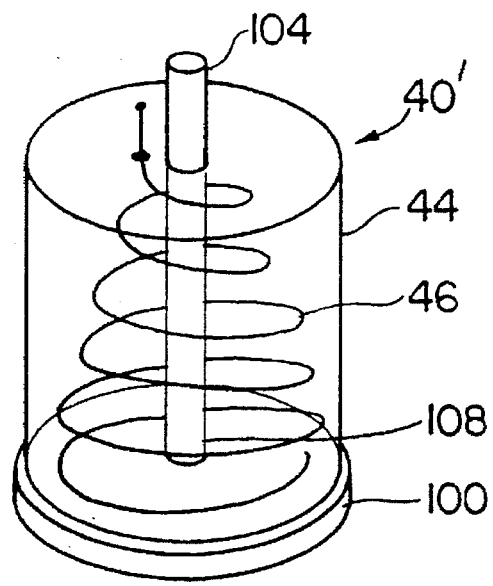
FIG. 5 is a perspective view of an embodiment of plasma source of the invention with integral gas feed.
Figure 6:
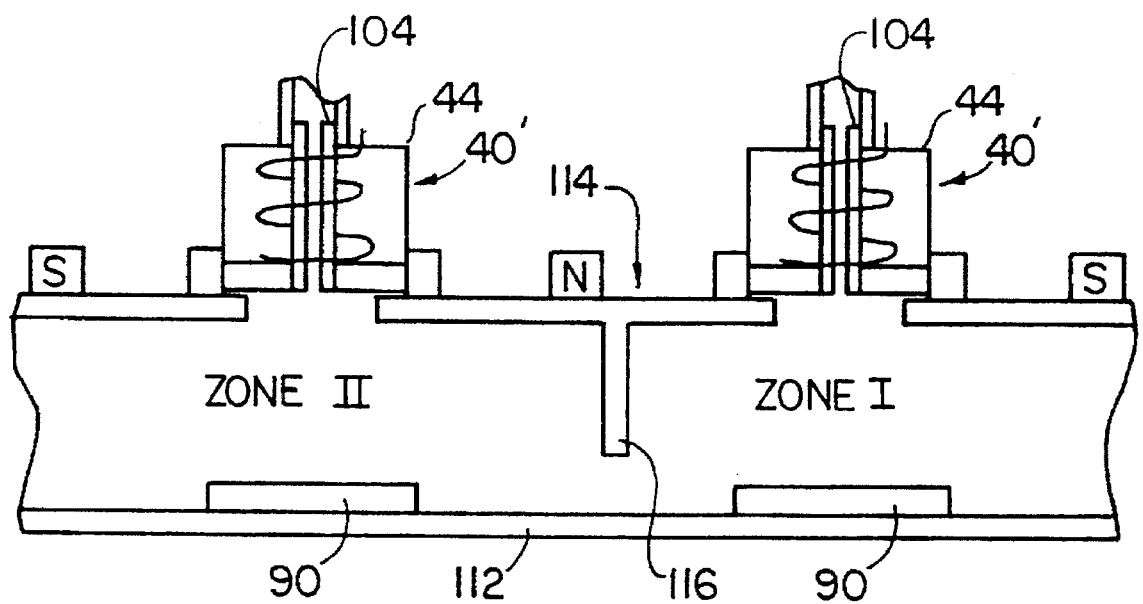
FIG. 6 is a cross-sectional view of an embodiment of a continuous plasma treatment device using a plurality of plasma sources shown in FIG. 5.

Referring to FIG. 5, in another embodiment, a quartz window 100 is not attached to the vacuum chamber 14, but instead encloses one end of the shield 44 of the plasma source 40'. In this embodiment, a tube 104 attached to an opening 108 in the quartz window 100 provides a gas feed to form a plasma of a specific gas. In this case, the plasma source 40' is not attached to a window 26 in the wall of the vacuum chamber 14, but is instead attached to the vacuum chamber 14 itself. Such plasma sources 40' can produce plasmas from specific gasses as are required by many processes. Several such plasma sources 40' can be aligned to sequentially treat a wafer 90 with different plasmas as in the embodiment of the inline system shown in FIG. 6. In this embodiment, wafers 90 are moved by a conveyor 112 through sequential zones, in this embodiment zones I and II, of a continuous processing line 114. Each zone is separated from the adjacent zones by a baffle 116. In one embodiment, the gas in zone I is $SiH_4$ used in Si-CVD processing, while the gas in zone II is $PH_3$ used in doping. In another embodiment, a cluster tool having load-locks to isolate each processing chamber from the other chambers, and equipped with a robot includes the rf plasma sources 40 of the invention for plasma CVD and plasma etching.

Figure 7:
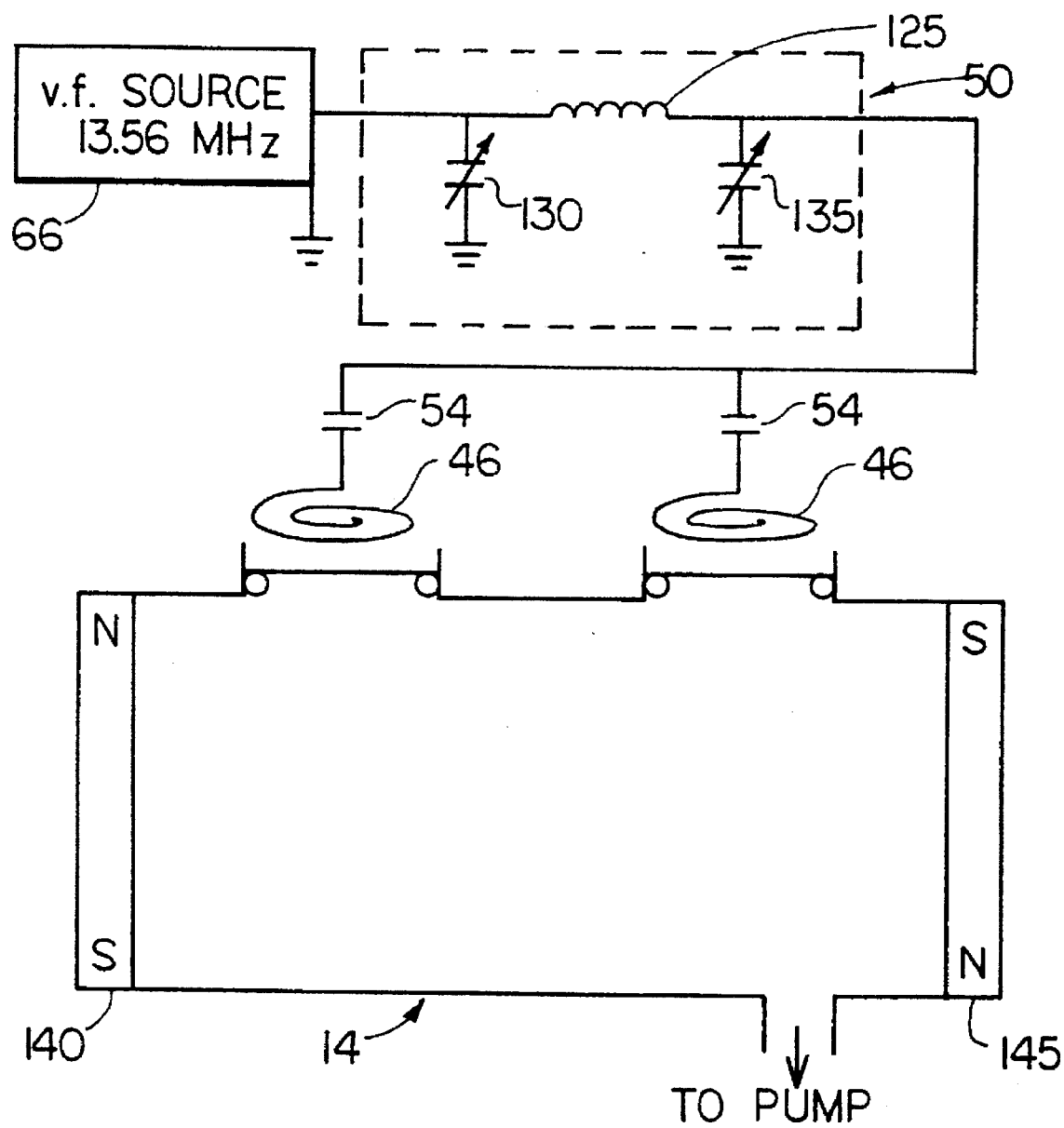
FIG. 7 is a schematic diagram of a system utilizing two plasma sources.

FIG. 7 depicts an embodiment of the system of the invention using two plasma sources. In this embodiment each source is an inductive pancake antenna 3–4 inches in diameter. Each antenna 46 is constructed of a ¼ inch copper tube and contains 5–6 turns. Each antenna 46 is connected to a matching network 50 through a respective 160 pf capacitor. The matching network 50 includes a 0.03 μH inductor 125 and two variable capacitors 130, 135. One variable capacitor 130 is adjustable over the range of 10–250 pf and the second capacitor 135 is adjustable over the range of 5–120 pf. The matching network 50 is tuned by adjusting the variable capacitor 130, 135. The matching network 50 is in turn connected to an rf source 66 operating at 13.56 mHz. A series of magnets 140, 145 are positioned around the circumference of the chamber in alternating polarity every 7 cm to form a magnetic bucket.

With the chamber operating at 1 m Torr pressure, the power to the antenna 46 is 25 W per antenna or about 50 W total. With the pressure in the chamber reduced to 0.1 m Torr, the power is increased to 200 W per antenna or 400 W total. The resulting plasma at 50 W total power has a substantially uniform density of $10^{11}/cm^3$. The uniformity and the density may be further improved using four of such sources.

Figure 8:
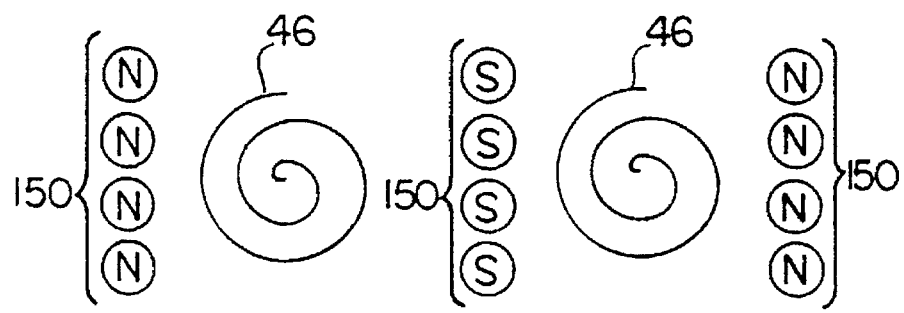
FIG. 8 depicts an embodiment of an arrangement of surface magnets for ECR plasma generation in a two source system.
Figure 8A:
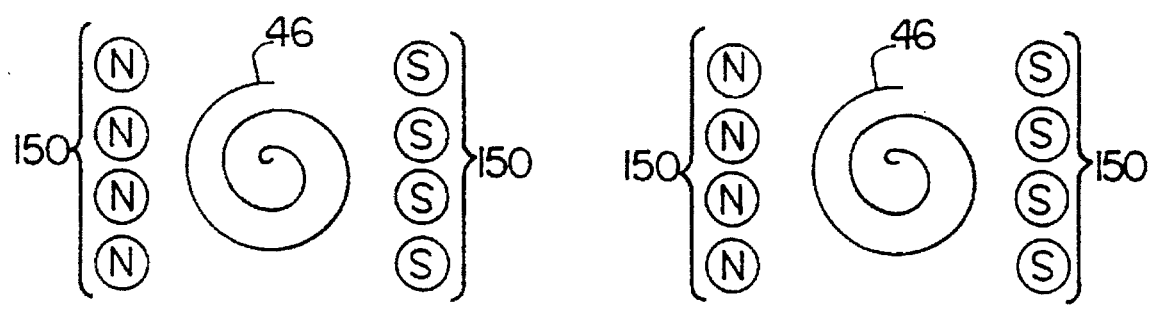
FIG. 8a depicts another embodiment of an arrangement of surface magnets for ECR plasma generation.

Referring to FIG. 8, one embodiment of the arrangement of magnets for ECR generation utilizes a plurality of magnets 150 adjacent the antenna 46. In this embodiment, the plurality of the magnets 150 is reversed between the antennae. FIG. 8a depicts another embodiment in which each source has its own set of magnets. Other magnet configurations are possible.

Having shown the preferred embodiment, those skilled in the art will realize many variations are possible which will still be within the scope and spirit of the claimed invention. Therefore, it is the intention to limit the invention only as indicated by the scope of the claims.

I claim:

1. A system for treating a substrate with a plasma, said system comprising:

a vacuum chamber in which a plasma is generated and having a plurality of substantially planar rf transparent windows on the surface of said chamber;

an rf generator;

at least two rf sources, each external to said vacuum chamber and each said rf source electrically connected to said rf generator and juxtaposed to a respective one of said plurality rf transparent windows, and operative to generate said plasma in the vacuum chamber;

said rf sources operative to produce a local, substantially uniform plasma proximate said substrate.

2. The system of claim 1 further comprising at least one tuning circuit, each said at least one tuning circuit electrically connected to one of said at least two rf sources.

3. The system of claim 2 further comprising:

at least one sensor measuring at least one characteristic of said plasma; and a controller receiving from said at least one sensor at least one characteristic of said plasma and controlling said plurality of tuning circuits in response thereto.

4. The system of claim 1 wherein each of said plurality of rf transparent windows is constructed of quartz.

5. The system of claim 1 wherein each of said plurality of rf transparent windows is constructed of glass.

6. The system of claim 3 wherein said at least one sensor is a Langmuir probe.

7. The system of claim 3 wherein said at least one sensor is an array of Faraday cups.

8. The system of claim 7 wherein said system further comprises a wafer holder and said Faraday cups are attached to said wafer holder.

9. The system of claim 7 wherein said system further comprises a test wafer having a plurality of Faraday cups on the surface of said test wafer.

10. The system of claim 3 wherein said at least one sensor is an optical sensor.

11. The system of claim 2 wherein said at least one tuning circuit comprises a tuning capacitor electrically connected in parallel with said respective RF source.

12. The system of claim 1 wherein each of said rf sources is independently adjustable to maintain the uniformity of said local plasma.

13. A plasma source comprising:

a shield open at a first end and having a shield aperture at a second end;

an rf antenna, positioned within the shield; and a dielectric window positioned to enclose said first end of said shield, said dielectric window defining a dielectric window aperture and having a dielectric gas inlet tube extending from said dielectric window aperture and through said shield aperture, to permit gas to pass through said shield and through said dielectric window aperture.

14. An inline continuous plasma processing system comprising:

a housing including a plurality of baffles located within said housing;

a plurality of RF plasma sources positioned along said housing between said baffles;

each said plasma source comprising:

a shield open at a first end and having a shield aperture at a second end;

an rf antenna, positioned within the shield; and a dielectric window positioned to enclose said first end of said shield, said dielectric window defining a dielectric window aperture and having a dielectric gas inlet tube extending from said dielectric window aperture and through said shield aperture, to permit gas to pass through said shield and through said dielectric window aperture into said housing; and a conveyor belt located within said housing, said conveyor belt conveying a wafer within said housing and below a plasma generated by each of said RF plasma sources between said baffles.

* * * * *